United States Patent [19]

Keezer

[11] Patent Number: 5,397,996
[45] Date of Patent: Mar. 14, 1995

[54] CONTINUITY TESTER USING A BRUSH TIPPED PROBE

[76] Inventor: David A. Keezer, 31775 Via Cordoba St., Temecula, Calif. 92592

[21] Appl. No.: 24,494

[22] Filed: Mar. 1, 1993

[51] Int. Cl.⁶ ........................................... G01R 31/02
[52] U.S. Cl. .................................. 324/754; 324/133; 324/537; 439/482
[58] Field of Search ............... 324/537, 66, 133, 158 P, 324/754, 72.5; 439/482

[56] References Cited

U.S. PATENT DOCUMENTS

| | | | |
|---|---|---|---|
| 2,806,995 | 9/1957 | Meanley | 324/66 |
| 3,777,260 | 12/1973 | Davies et al. | 324/715 |
| 3,831,089 | 8/1974 | Pearce | 324/122 |
| 3,917,995 | 11/1975 | Clinton | 324/517 |
| 4,052,793 | 10/1977 | Coughlin et al. | 324/537 X |
| 4,056,773 | 11/1977 | Sullivan | 324/537 X |
| 4,145,651 | 3/1979 | Ripingill | 324/72.5 |
| 4,414,506 | 11/1983 | Kelley | 324/158 P |
| 4,982,154 | 1/1991 | Schwabe et al. | 324/158 P |
| 5,276,395 | 1/1994 | Malloy | 324/158 P |

Primary Examiner—Kenneth A. Wieder
Assistant Examiner—Glenn W. Brown

[57] ABSTRACT

An electrical continuity tester employing two test probe assemblies (10) (12), one of which employs a conductive brush tip (26) at one end and a solid pointed tip (14) at the other. The brush tip of the probe allows rapid localization of continuity by sweeping the area to be tested with the brush tip of the probe until an audible tone or visual indication occurs. Conducting a point-to-point search within the area previously identified by the brush tip identifies the actual point of continuity. The solid pointed tip of the same probe accomplishes this task. To reduce risk of damage to the circuit under test, the tester applies less than 1 volt through the test probes. The tester employs a pulse stretching circuit to electrically stretch the pulse generated by a successful continuity event to a minimum duration so that even very brief contact duration made by the probes between two points of electrical continuity will result in a clearly audible tone or visual indication.

5 Claims, 4 Drawing Sheets

CONTINUITY TESTER USING A BRUSH TIPPED PROBE

BACKGROUND—FIELD OF INVENTION

This invention relates to electrical continuity testing, specifically to a scheme for rapidly identifying points of electrical continuity in a printed circuit board or other electrical circuit by sweeping with a brush-tipped probe.

BACKGROUND—DESCRIPTION OF PRIOR ART

It is a commonly used method of fault isolation in electrical circuits to use a continuity measuring instrument. Usually the instrument produces an audible or visual indication when a sufficiently low impedance occurs between its probes. This occurs in prior art by contacting one point with one of two test probes and then contacting other points in the circuit with the other test probe one by one until determining if continuity exists. Although this is referred to in U.S. Pat. No. 3,831,089, assigned to Pearce (1974), this design applies 6 volts to the circuit under test during use. This may damage sensitive circuitry, or at least allow false continuity indications to occur, as through diode junctions. Also, this point-to-point search method can be a very time consuming and tedious process owing to the large number of test points in complex electrical circuits.

What is needed is a way to safely and rapidly consolidate the area in which to conduct a point-to-point search. The present invention accomplishes this by making multiple contacts simultaneously using a metallic brush tip on one of the test probes to identify the approximate location of the point of continuity. The exact location can then be determined by singularly point-to-point probing only the points in the immediate area. Additionally, the present invention applies a test voltage of less than 1 volt, thereby providing low risk to the circuit under test.

At present, commercially available test equipment capable of continuity testing have no means of making a multiplicity of contacts as does this invention. Although regularly used in electronics manufacturing and service, a continuity test function usually resides in test equipment with other functions such as voltage and current measurement. Since having a multiplicity of contacts with an energized circuit is undesirable, as when making voltage or current measurements, these instruments employ singularly pointed probes only. However, by isolating the continuity function in a separate instrument and providing it with a metallic brush tip, one realizes a surprisingly great improvement in efficiency.

Though multiple contact apparatus in electrical continuity testing has been previously applied in prior art, these applications do not meet the objectives of the present invention. U.S. Pat. No. 3,777,260 to Davies et.al. (1973) discloses a device for checking electrical continuity with ceramic wafer points using a grid of lines as a probe in a specific and rigidly held pattern. U.S. Pat. No. 4,982,154 to Schwabe et.al (1991) also discloses a specific application of a multiple, simultaneous electrical contact apparatus in the pursuit of pipe testing. These are not apparatus suitable for printed circuit board testing. A brush-equipped contact assembly used in the testing of electrical cable insulation shows up in U.S. Pat. No. No. 3,917,995 to Clinton (1975). The brushes in this mechanism address a specific test application that does not lend itself to portable, hand-held fault isolation of printed circuit board assemblies or other electrical circuitry.

Also, in no prior art is there mention of providing a scheme for lengthening the period of audible or visual indication to allow for very short contact duration by the test probes. The present invention accomplishes this to exploit a brush-tipped probe in a rapid sweeping motion over the circuit to be tested.

BRIEF DESCRIPTION OF THE INVENTION

Accordingly, several objects of my invention are to:
(a) provide a continuity measurement circuit that applies a low level voltage and current to the circuit under test, and that reacts to low impedance between two test probes causing an audible tone or visual indication to occur;
(b) electrically stretch the pulse generated by a successful continuity event to a minimum duration so that even very brief contact duration made by the probes between two points of electrical continuity will result in a clearly audible tone or visual indication; and
(c) provide a test probe utilizing a plurality of electrically conductive metallic strands in a brush configuration at one end, and a pointed singular probe at the opposing end.

Further objects and advantages of my invention will become apparent from a consideration of the drawings and ensuing description of them.

BRIEF DESCRIPTION OF THE DRAWINGS

The detailed description of the invention that follows will be understood with greater clarity by referring to the accompanied drawings in which.

REFERENCE NUMERALS IN DRAWING

| | |
|---|---|
| 10 reference probe assembly | 12 search probe assembly |
| 14 solid pointed metallic tip | 16 non-conductive holder |
| 18 insulated wire | 20 electrical circuit board assembly |
| 22 non-conductive housing | 24 1.5V battery |
| 26 conductive brush tip | 28 5.0K ohm resister |
| 30 operational amplifier A | 32 10K ohm resister |
| 34 operational amplifier B | 36 operational amplifier C |
| 38 1.00K ohm resistor | 40 16.0K ohm resistor |
| 42 4.0K ohm resistor | 44 1Meg ohm resistor |
| 46 operational amplifier D | 48 ICM7555IP integrated circuit |
| 50 4.7K ohm resistor | 52 47 µF capacitor |
| 54 2K ohm resistor | 56 MPS-A42 transistor |
| 58 indicating device | |

DETAILED DESCRIPTION OF THE PREFERRED EMBODIMENT

Figure 1:
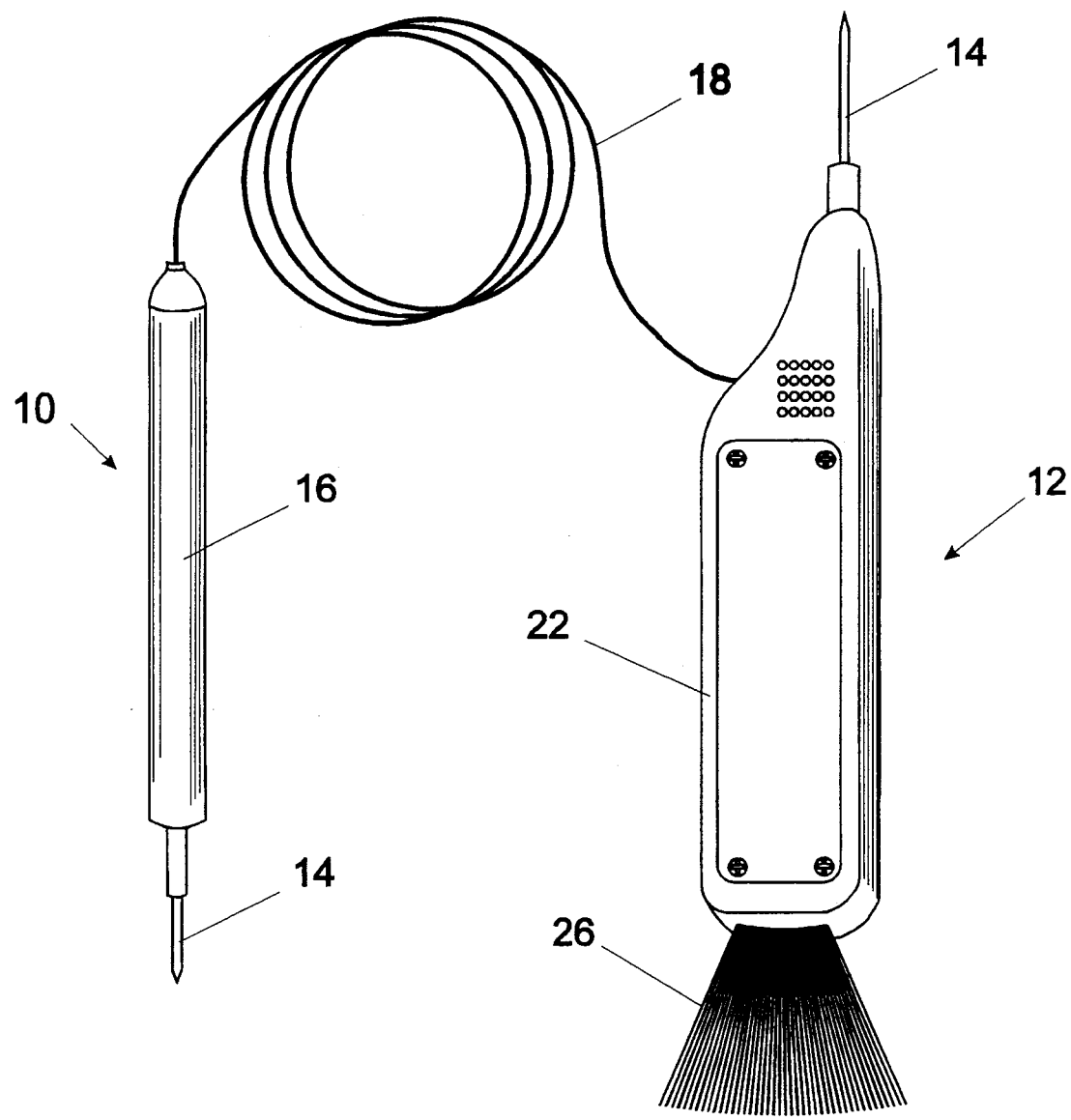
FIG. 1 shows various aspects of the preferred embodiment of a dual-probe continuity test apparatus utilizing a conductive brush tip on one of its probes.

FIG. 1 depicts an embodiment of a hand-held device according to the invention for localizing and identifying electrical continuity between a reference probe assembly 10 and a search probe assembly 12.

The reference probe assembly consists of a solid pointed metallic tip 14 mounted at the end of a non-conductive holder 16. The holder, though depicted in the drawings as tubular, could be of any shape that allows convenient grasping by hand. An insulated wire 18 electrically connects the metallic tip of the reference probe to the internal electronics in the search probe.

The search probe assembly incorporates a non-conductive housing 22, an electrically conductive brush tip 26, and a solid pointed metallic tip 14 situated opposing the brush tip. Holes in the housing provide a means for conveyance of an audible indication. If a visual indication is preferred, a suitable lens would be used instead.

Figure 2:
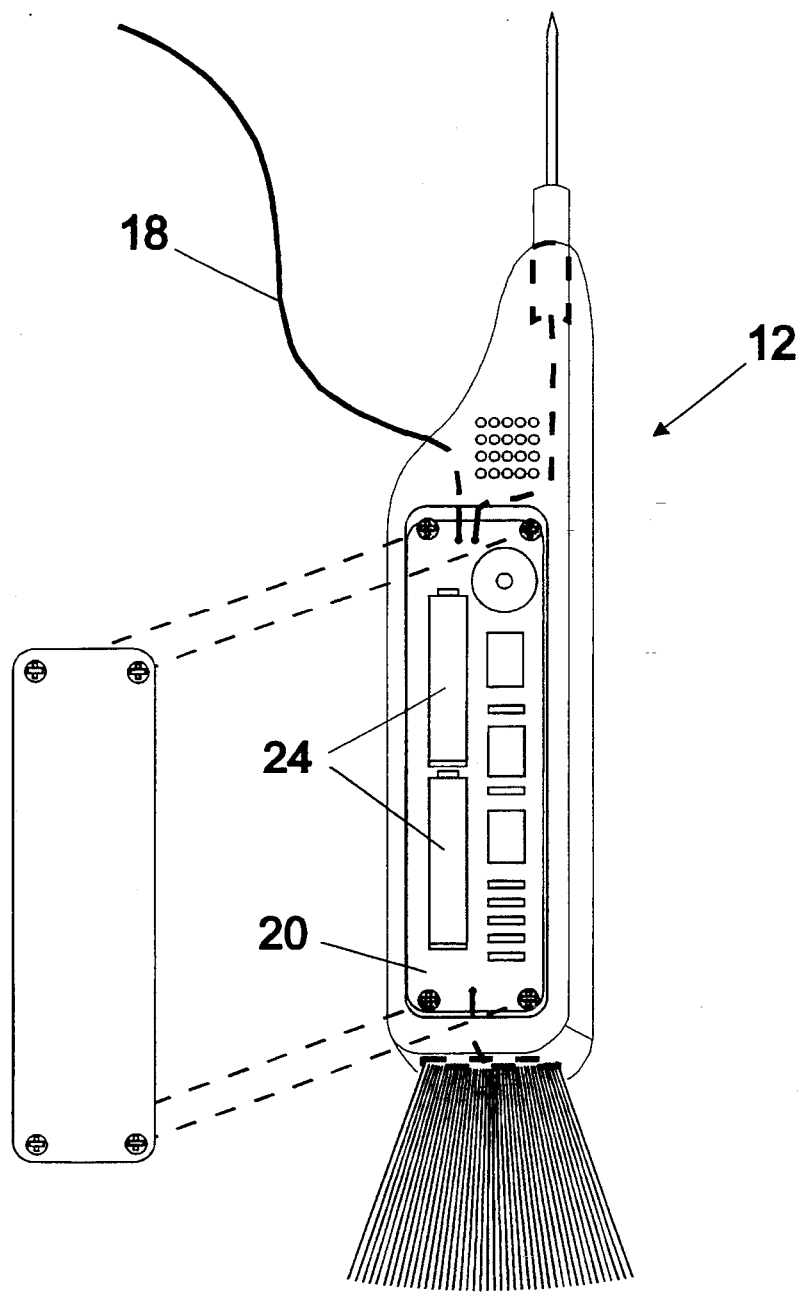
FIG. 2 shows a search probe with its internal configuration revealed.

FIG. 2 shows the search probe with its internal configuration revealed. Shown is a generalized format for an electrical circuit board assembly 20 that accompanies batteries 24 inside the housing. The drawing also shows a scheme of routing wiring internally to provide the necessary electrical connections to the pointed tip as well as the brush tip.

Figure 3:
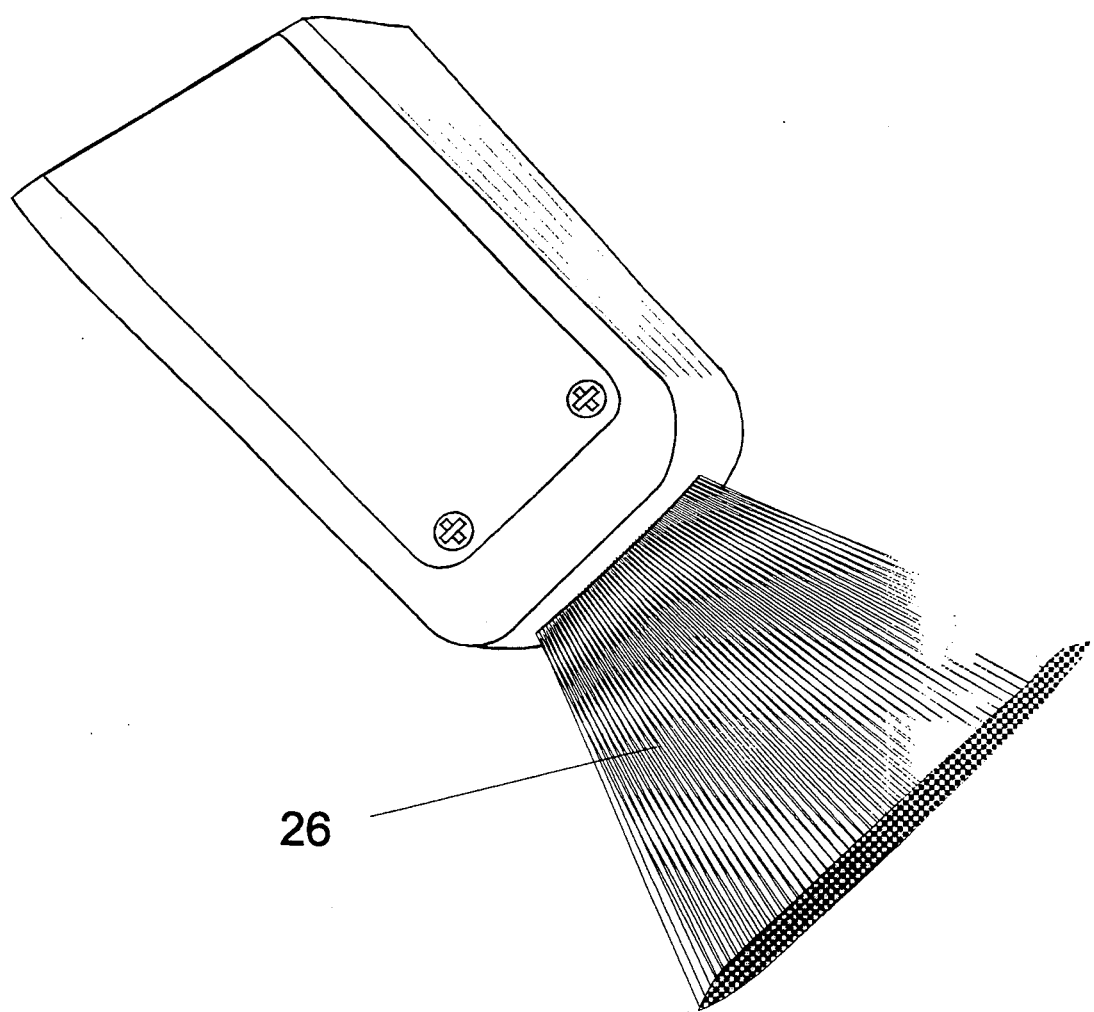
FIG. 3 shows a detailed view of a brush tip at the end of the search probe.

The brush tip employs strands of fine metallic fibers typically 3 to 8 mm long. An example of the material used would be stainless steel. As depicted in FIG. 3, the strands of the brush tip lay in roughly parallel alignment with each other and firmly attach to one longitudinal extremity of the search probe. The strands are flexible enough to bend with even slight applied pressure from any direction. The strands, upon being bent during use, are resilient enough to spring back to their original position thereby maintaining a consistent shape after use. The strands are sufficiently pliable to disallow causing damage to the printed circuit board or other electrical circuitry under test as the strands brush over the circuitry. Such material is available commercially in the form of cleaning or other special purpose brushes and would be readily adaptable to manufacturing for this application.

The electrical circuit board assembly within the search probe embodies an electrical circuit whose function is to apply a source of electrical current to the reference probe, and a current return path for both the brush tip and the pointed tip of the search probe. The electrical circuit further provides a method of detecting a drop in voltage between the reference and search probes caused by passing current through the impedance under test. It amplifies the amount of this voltage and compares this amplified voltage to a reference voltage. The result of the voltage comparison is to trigger a pulse-producing circuit that causes an audible or visual indication of sufficient duration to occur.

Figure 4:
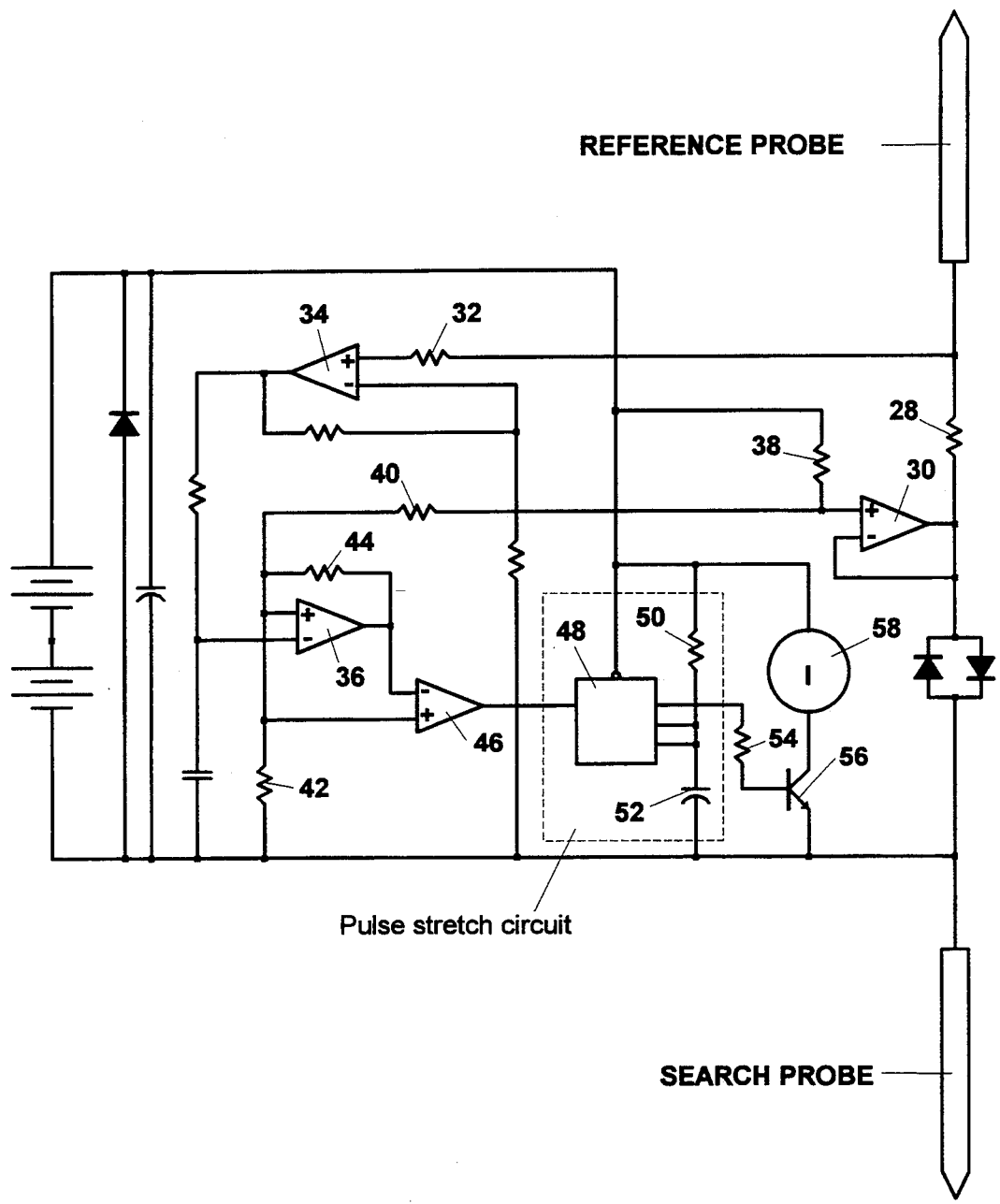
FIG. 4 shows an electrical schematic of a continuity test circuit featuring a pulse stretching constituent.

Referring to FIG. 4, the schematic of the circuit can be followed in greater detail. Current flows to the reference probe through resistor 28 whose voltage source is operational amplifier 30. Voltage occurring across the unknown impedance between the reference probe and the search probe passes through a resistor 32 to an operational amplifier 34 that applies a gain. The amplified voltage passes to a voltage comparator 36 for comparison with a reference voltage provided by resistor 38, resistor 40, and resistor 42. Resistor 44 provides switching hysteresis. Upon switching, the comparator output is polarity reversed by operational amplifier 46. This signal continues on to a pulse stretching circuit composed of integrated circuit 48, resistor 50, and capacitor 52. This circuit produces a voltage pulse lasting approximately ½ second. This pulse converts to current by resistor 54 and conducts to the base of transistor 56. This transistor has its emitter connected to circuit ground, and its collector tied to the negative pole of a suitable audible or visual indicating device 58. When energized, the transistor conducts current through the indicating device to ground causing the indication to occur.

Operation

Using this invention, one identifies continuity between two points with three simple steps. First, hold the tip of the reference probe in contact with a point of desired test. Second, sweep the search area with the brush tip of the search probe until localizing continuity by an audible tone or visual indication. Third, identify the actual point of continuity by using the pointed tip at the other end of the search probe to conduct a point-to-point search within the area previously identified by the brush tip. Such technique permits rapid localization and subsequent identification of points of electrical continuity.

Summary, Ramifications, and Scope

Certain novel aspects of the design warrant further illumination. First, in the invention's preferred embodiment, the design establishes the voltage applied to the reference probe to be approximately ½ volt and the current to approximately 100 $\mu$A. The resulting power applied to the circuit under test is therefore limited to approximately 50 micro watts. This is for the protection of the circuit under test.

Further novelty emerges with a brush tip consisting of conductive metallic fibers that allow making a plurality of contacts simultaneously with the circuit under test.

Additional novelty takes place by the utilization of a pulse stretching circuit to maintain a conveniently minimum duration of audible or visual notification to the operator of successful continuity regardless of how brief.

While I have described this invention in a preferred embodiment above, one should understand that numerous modifications and substitutions can be had without departing from the spirit of the invention. For example, housing the search probe and the tester's electrical circuit board separately is possible. This would allow for less weight and bulk of the search probe. Furthermore, one might separate the search probe tips into two separate probe assemblies connected by insulated wire instead of being opposite each other in a single assembly.

Also, the reference probe might use a clip-on style tip instead of a pointed tip to facilitate attachment to the contact point in question.

The tester's electrical circuit might be modified in several ways, also without departing from the spirit of the invention. For example, though the preferred embodiment reflects battery operation for portability, the invention could operate from a line operated power source. Additionally, implementing the aforementioned novelties of the tester's electrical circuit design is possible by adopting various designs and components.

Accordingly, I have described the present invention in a preferred embodiment by way of illustration rather than limitation.

I claim:

1. Continuity testing apparatus for identifying continuity between a first contact point and a region containing a second contact point, which comprises:

a first single point electrically conductive probe;

a second probe comprising a plurality of closely spaced electrically conductive fibers, said fibers making contact with a plurality of contact points;

electrical means connected to said first and second probes for determining whether electrical continuity exists between said first probe and any of said closely spaced fibers of said second probe; and indicating means for producing a human recognizable signal indicating existence of said electrical continuity.

2. The apparatus according to claim 1 wherein said second probe comprises a brush formed of closely spaced flexible metal fibers.

3. The apparatus according to claim 1 further including a third probe comprising a single point electrically conductive probe wired in parallel with said second probe.

4. Continuity testing apparatus for identifying continuity between a first contact point and a second contact point, which comprises:

a single point electrically conductive first probe;

a second probe comprising a plurality of electrically conductive fibers, said fibers contacting a region containing a plurality of contact points;

a single point third probe electrically connected to said second probe in parallel therewith;

electrical means connected between said first and combination of second and third probes for determining whether electrical continuity exists between said first probe and either of said second and third probes; and indicating means for producing a human recognizable signal indicating existence of said electrical continuity;

whereby a region containing a location in continuity with said first contact point is determined with said second probe and the precise location is determined with said third probe.

5. A method of identifying continuity between a first contact point and a region containing a second contact point, which comprises:

providing a first single point electrically conductive probe, a second probe comprising a plurality of closely spaced, flexible, electrically conductive fibers and a third probe having a single point connected in parallel with said second probe;

providing electrical signal means for indicating existence of electrical continuity between said first probe and either of said second and third probes;

contacting a selected first contact point in an electrical circuit with said first probe, moving the fibers of said second probe across said circuit until said signal means indicates continuity between said first contact point and a contact point within the region covered by said plurality of flexible fibers;

removing said second probe from contact with said circuit; and touching said third probe to various locations within said region until a precise electrical continuity location is signaled.

* * * * *